(12) United States Patent
Nishio

(10) Patent No.: US 12,289,828 B2
(45) Date of Patent: Apr. 29, 2025

(54) CIRCUIT BOARD

(71) Applicant: Murata Manufacturing Co., Ltd., Nagaokakyo (JP)

(72) Inventor: Kosuke Nishio, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 182 days.

(21) Appl. No.: 18/096,048

(22) Filed: Jan. 12, 2023

(65) Prior Publication Data

US 2023/0156913 A1    May 18, 2023

Related U.S. Application Data

(63) Continuation of application No. PCT/JP2021/024760, filed on Jun. 30, 2021.

(30) Foreign Application Priority Data

Jul. 16, 2020    (JP) ................................ 2020-122128

(51) Int. Cl.
*H05K 1/00*      (2006.01)
*H05K 1/02*      (2006.01)

(52) U.S. Cl.
CPC ......... *H05K 1/0298* (2013.01); *H05K 1/0242* (2013.01); *H05K 2201/09727* (2013.01)

(58) Field of Classification Search
CPC ............... H05K 1/0298; H05K 1/0242; H05K 2201/09727
See application file for complete search history.

(56) References Cited

U.S. PATENT DOCUMENTS

| | | |
|---|---|---|
| 6,686,808 B1 | 2/2004 | Sugawara et al. |
| 8,884,644 B1 | 11/2014 | Ben Artsi |
| 2008/0236876 A1* | 10/2008 | Kodama ............... G02B 6/43 |
| | | 174/260 |
| 2015/0280778 A1 | 10/2015 | Ding et al. |
| 2017/0084974 A1 | 3/2017 | Baba et al. |

FOREIGN PATENT DOCUMENTS

| | | |
|---|---|---|
| JP | 2000004108 A | 1/2000 |
| JP | 2009105630 A | 5/2009 |
| WO | 2015186720 A1 | 12/2015 |

OTHER PUBLICATIONS

JP 2000-04108A English Translation (Year: 2000).*
International Search Report in PCT/JP2021/024760, mailed Sep. 21, 2021, 3 pages.
Written Opinion in PCT/JP2021/024760, mailed Sep. 21, 2021, 3 pages.

* cited by examiner

*Primary Examiner* — Pete T Lee
(74) *Attorney, Agent, or Firm* — Keating & Bennett, LLP

(57) ABSTRACT

A circuit board includes a first section on a left side of a third section in a signal-conductor-layer left-right direction and extending in parallel or substantially in parallel with the third section in a signal-conductor-layer front-back direction when viewed in a stacking direction. The first section includes first thin line portions and first thick line portions, each of the first thick line portions has a line width greater than a line width of each of the first thin line portions. The first thin line portions and the first thick line portions are alternately arranged in the signal-conductor-layer front-back direction. In the signal-conductor-layer left-right direction, center lines of the first thin line portions are positioned leftward relative to center lines of the first thick line portions.

19 Claims, 10 Drawing Sheets

Fig.1
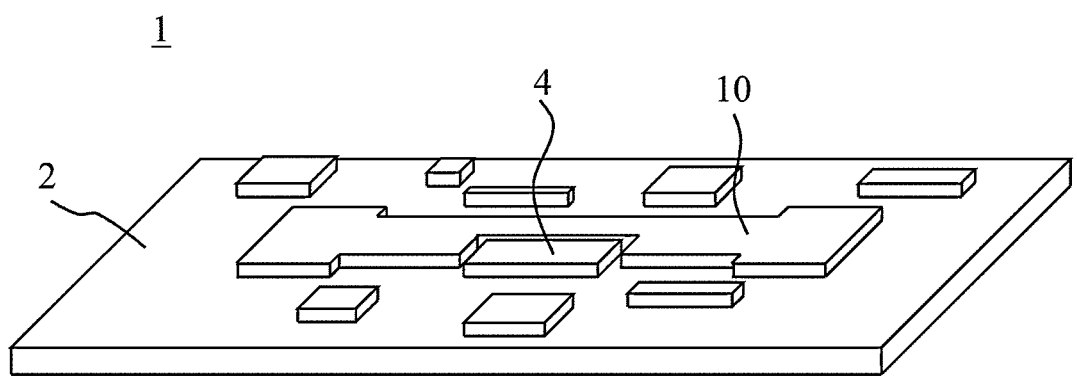
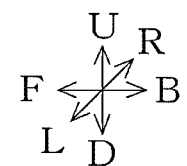

Fig.2
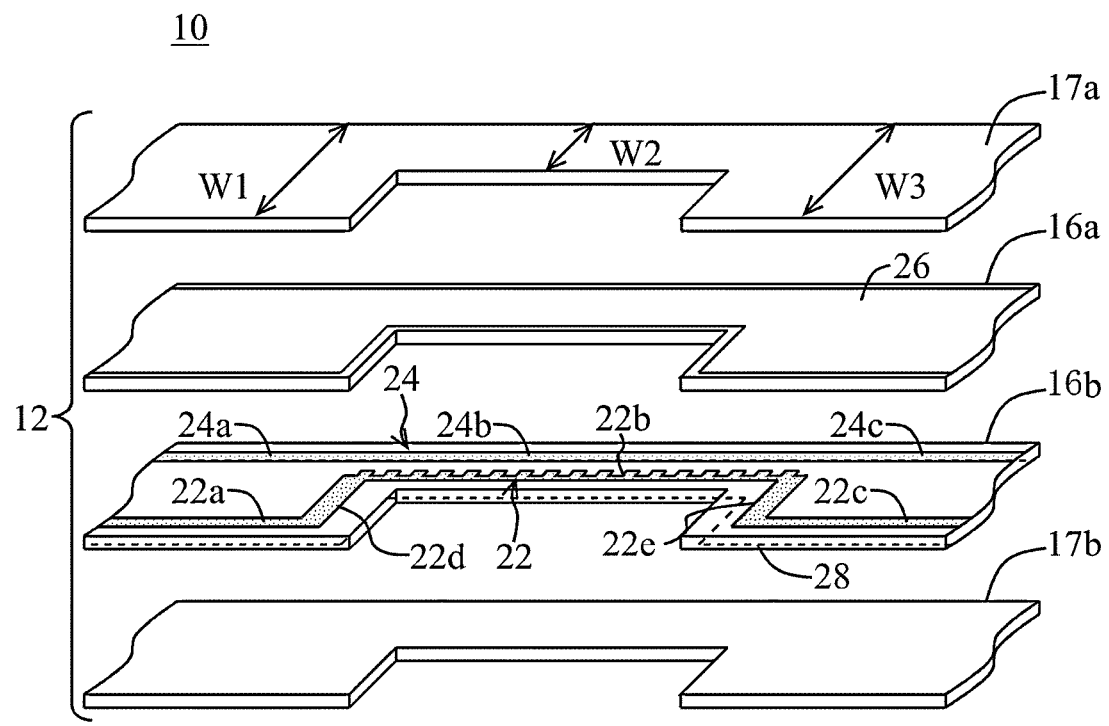
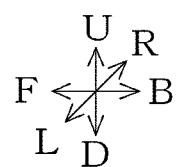

Fig.3
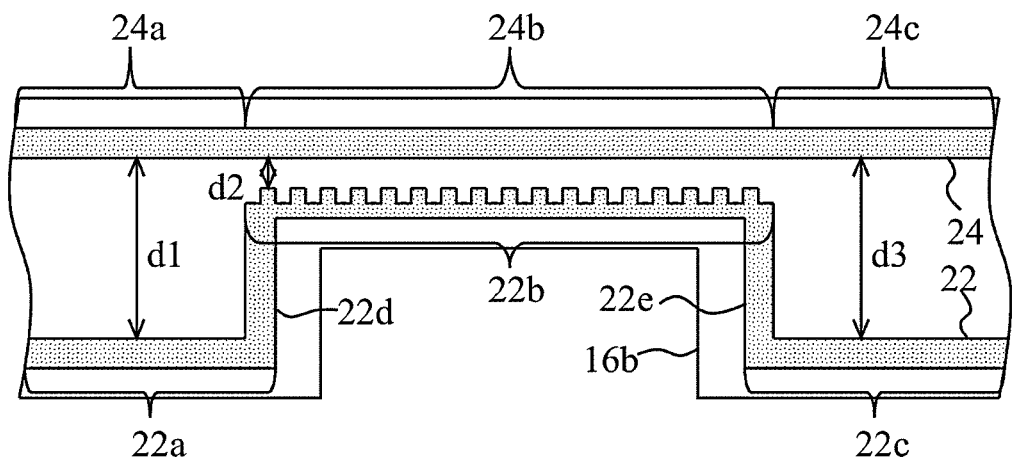
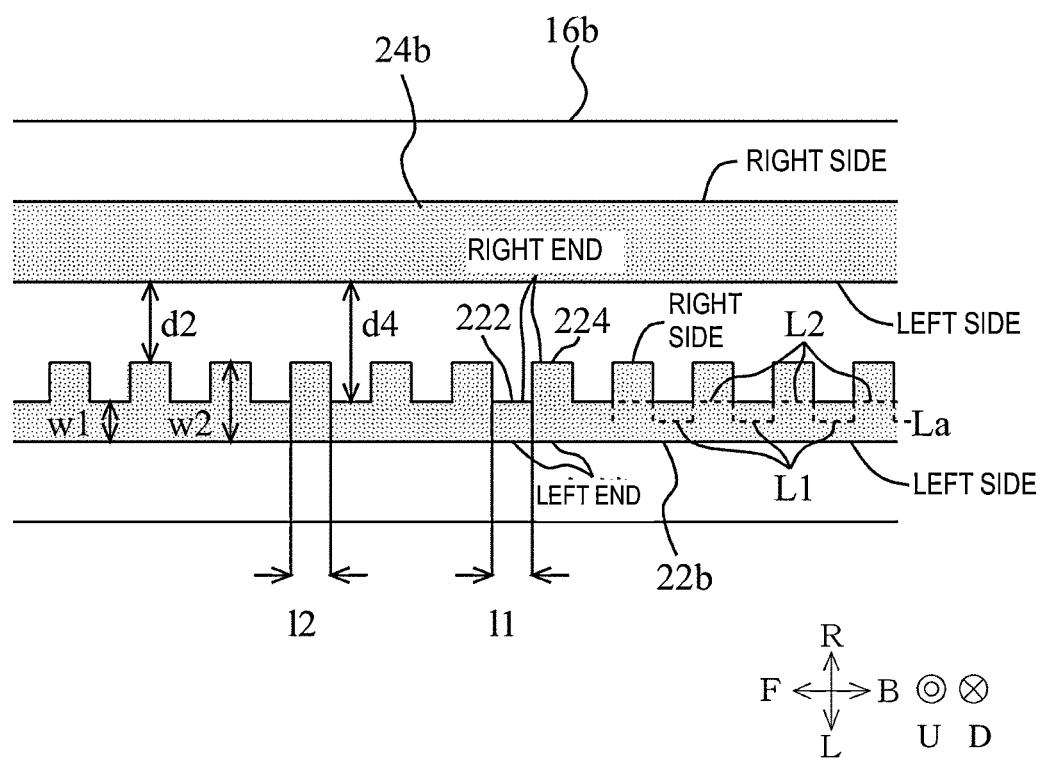

Fig.6
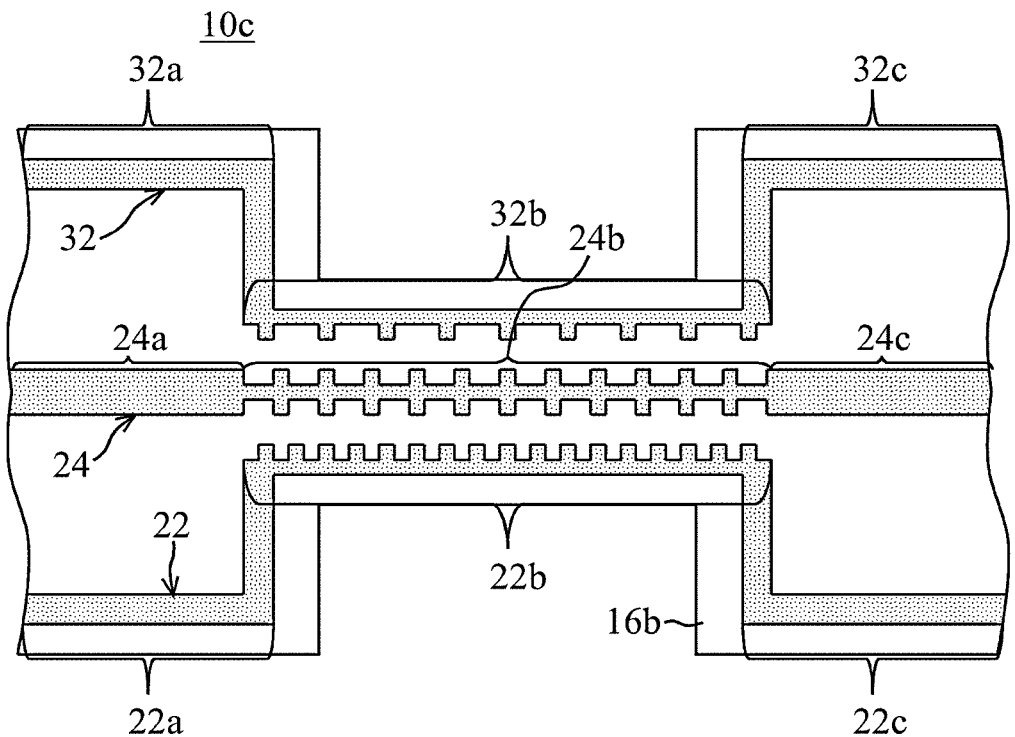
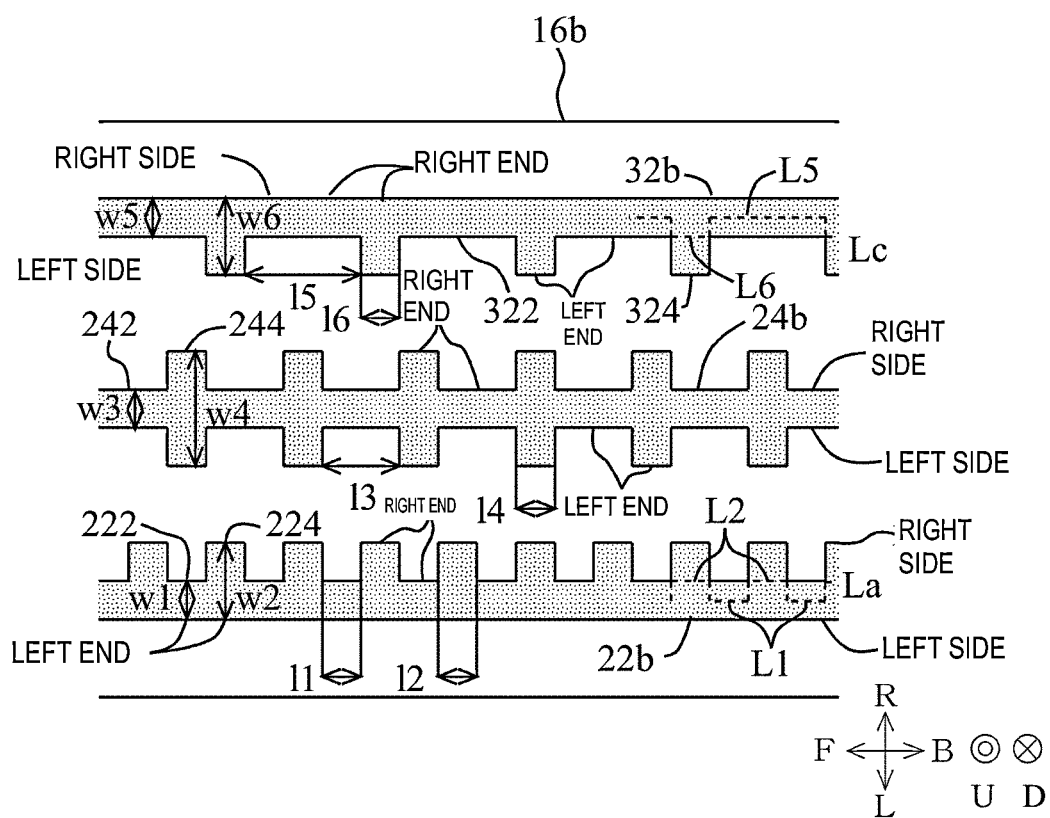

Fig.7
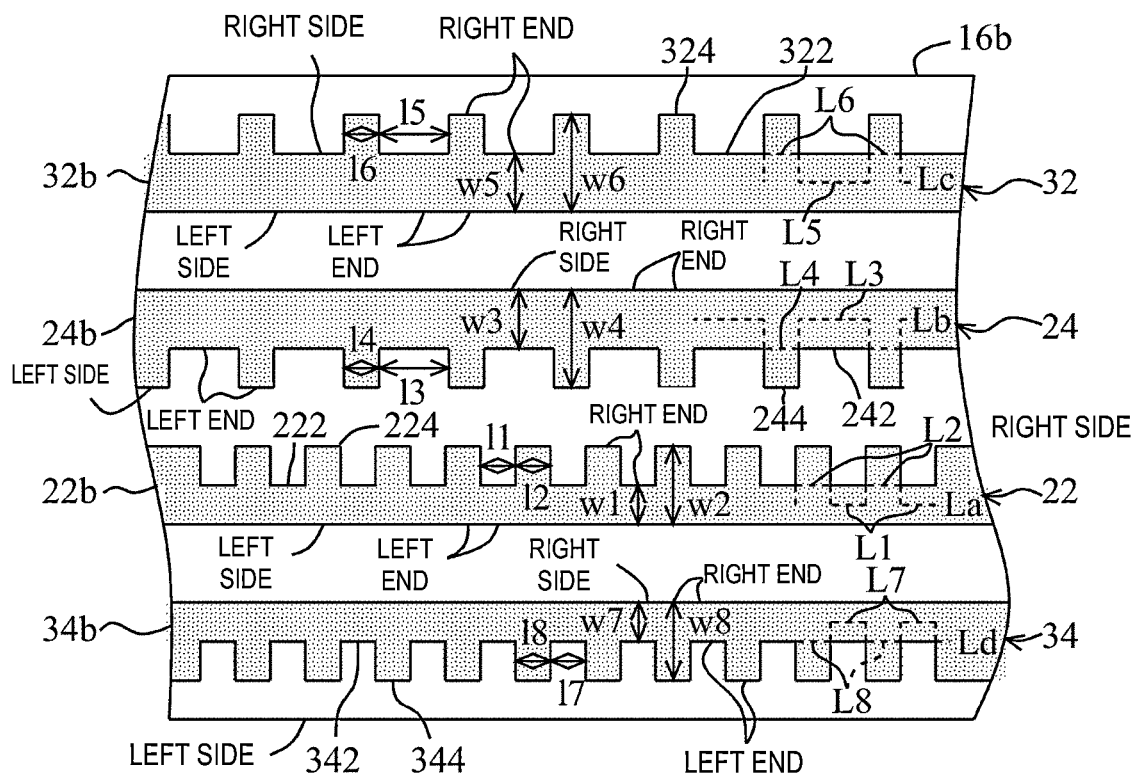
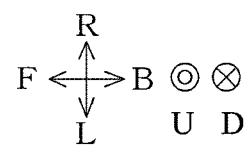

Fig.9
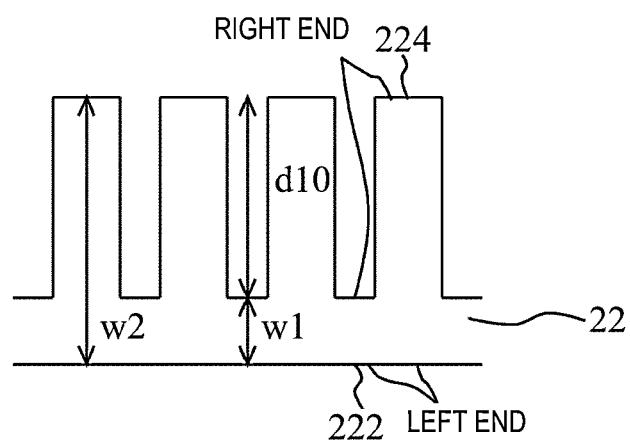
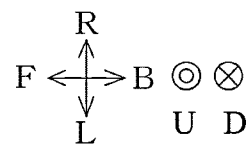

Fig.10
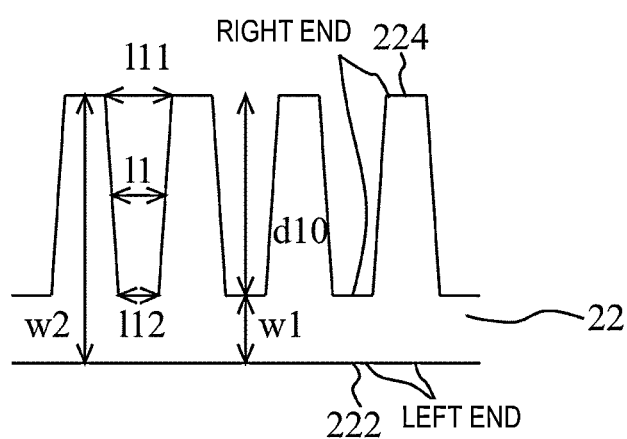
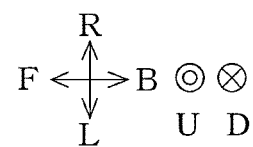

CIRCUIT BOARD

CROSS REFERENCE TO RELATED APPLICATIONS

This application claims the benefit of priority to Japanese Patent Application No. 2020-122128 filed on Jul. 16, 2020 and is a Continuation Application of PCT Application No. PCT/JP2021/024760 filed on Jun. 30, 2021. The entire contents of each application are hereby incorporated herein by reference.

BACKGROUND OF THE INVENTION

1. Field of the Invention

The present disclosure relates to a circuit board including a first signal conductor layer and a second signal conductor layer.

2. Description of the Related Art

Regarding inventions related to existing circuit boards, a transmission line described in International Publication No. 2015/186720 is known. The transmission line includes a dielectric body, a first signal conductor, a second signal conductor, a first-signal-conductor ground portion, a second-signal-conductor ground portion, and an intermediate portion. The dielectric body includes plural dielectric layers that are stacked in an up-down direction. The first signal conductor and the second signal conductor are arranged in a left-right direction. The first-signal-conductor ground portion is disposed above the first signal conductor. The second-signal-conductor ground portion is disposed below the second signal conductor. The intermediate portion connects the first-signal-conductor ground portion and the second-signal-conductor ground portion to one another. Thus, the intermediate portion is disposed between the first signal conductor and the second signal conductor. As a result, the first signal conductor and the second signal conductor are prevented from being coupled to one another.

As described above, in such a transmission line including plural signal conductors, it is desirable to prevent the coupling between the plural signal conductors.

SUMMARY OF THE INVENTION

Preferred embodiments of the present invention provide circuit boards with each of which a first signal conductor layer and a second signal conductor layer are able to be prevented from being coupled to one another.

A circuit board according to a preferred embodiment of the present invention includes a board body including a plurality of insulator layers that are stacked, a first signal conductor layer in the board body and including a first section, and a second signal conductor layer in the board body and including a third section. A line width direction of the first signal conductor layer is defined as a signal-conductor-layer left-right direction. A direction in which the first signal conductor layer extends is defined as a signal-conductor-layer front-back direction. When viewed in a stacking direction of the plurality of insulator layers, the first section is on the left of the third section in the signal-conductor-layer left-right direction and extends, in parallel or substantially in parallel with the third section, in the signal-conductor-layer front-back direction. The first section includes a plurality of first thin line portions and a plurality of first thick line portions, each of the plurality of first thin line portions has a line width, and each of the plurality of first thick line portions has a line width greater than the line width of the plurality of first thin line portion. The plurality of first thin line portions and the plurality of first thick line portions are alternately arranged in the signal-conductor-layer front-back direction. In the signal-conductor-layer left-right direction, center lines of the plurality of first thin line portions are positioned leftward relative to center lines of the plurality of first thick line portions.

Hereinafter, the terms used in the description of preferred embodiments of the present description will be defined. Hereinafter, a first member, a second member, and a third member mean, for example, members provided for the circuit board. In the present description, except where specifically described, portions of the first member will be defined as follows. A front portion of the first member means the front half of the first member. A rear portion of the first member means the rear half of the first member. A left portion of the first member means the left half of the first member. A right portion of the first member means the right half of the first member. An upper portion of the first member means the upper half of the first member. A lower portion of the first member means the lower half of the first member. A front end of the first member means the forward end of the first member. A rear end of the first member means the rearward end of the first member. A left end of the first member means the leftward end of the first member. A right end of the first member means the rightward end of the first member. An upper end of the first member means the upward end of the first member. A lower end of the first member means the downward end of the first member. A front end portion of the first member means the front end of the first member and the vicinity of the front end. A rear end portion of the first member means the rear end of the first member and the vicinity of the rear end. A left end portion of the first member means the left end of the first member and the vicinity of the left end. A right end portion of the first member means the right end of the first member and the vicinity of the right end. An upper end portion of the first member means the upper end of the first member and the vicinity of the upper end. A lower end portion of the first member means the lower end of the first member and the vicinity of the lower end.

When any two members described in the present description are defined as the first member and the second member, the relationship between the two selected members is as follows. In the present description, a state in which the first member is supported by the second member includes a state in which the first member is attached to the second member so as not to move relative to the second member (that is, the first member is fixed to the second member) and a state in which the first member is attached to the second member so as to move relative to the second member. In addition, the state in which the first member is supported by the second member includes a state in which the first member is directly attached to the second member and a state in which the first member is attached to the second member with the third member interposed therebetween.

In the present description, the state in which the first member is fixed to the second member includes a state in which the first member is attached to the second member so as not to move relative to the second member but does not include a state in which the first member is attached to the second member so as to move relative to the second member. In addition, the state in which the first member is fixed to the second member includes a state in which the first member is directly attached to the second member and a state in which the first member is attached to the second member with the third member interposed therebetween.

In the present description, the phrase "the first member and the second member are electrically connected to one another" means that a direct current can flow between the first member and the second member. Thus, the first member and the second member may be in contact with one another, or the first member and the second member are not necessarily in contact with one another. When the first member and the second member are not in contact with one another, the third member having electrical conductivity is disposed between the first member and the second member.

With circuit boards according to preferred embodiments of the present invention, the first signal conductor layer and the second signal conductor layer are able to be prevented from being coupled to one another.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is an external perspective view of an electronic device 1 including a circuit board 10 according to a preferred embodiment of the present invention.

FIG. 2 is an exploded perspective view of the circuit board 10.

FIG. 3 illustrates, in top view, a first signal conductor layer 22, a second signal conductor layer 24, and an insulator layer 16b of the circuit board 10.

FIG. 6 illustrates, in top view, a first signal conductor layer 22, a second signal conductor layer 24, a third signal conductor layer 32, and an insulator layer 16b of a circuit board 10c according to a preferred embodiment of the present invention.

FIG. 7 is a top view of a first signal conductor layer 22, a second signal conductor layer 24, a third signal conductor layer 32, a fourth signal conductor layer 34, and an insulator layer 16b of a circuit board 10d according to a preferred embodiment of the present invention.

FIG. 9 is an enlarged view of a first signal conductor layer 22 of a circuit board according to a preferred embodiment of the present invention.

FIG. 10 is an enlarged view of a first signal conductor layer 22 of a circuit board according to a preferred embodiment of the present invention.

DETAILED DESCRIPTION OF THE PREFERRED EMBODIMENTS

Figure 4:
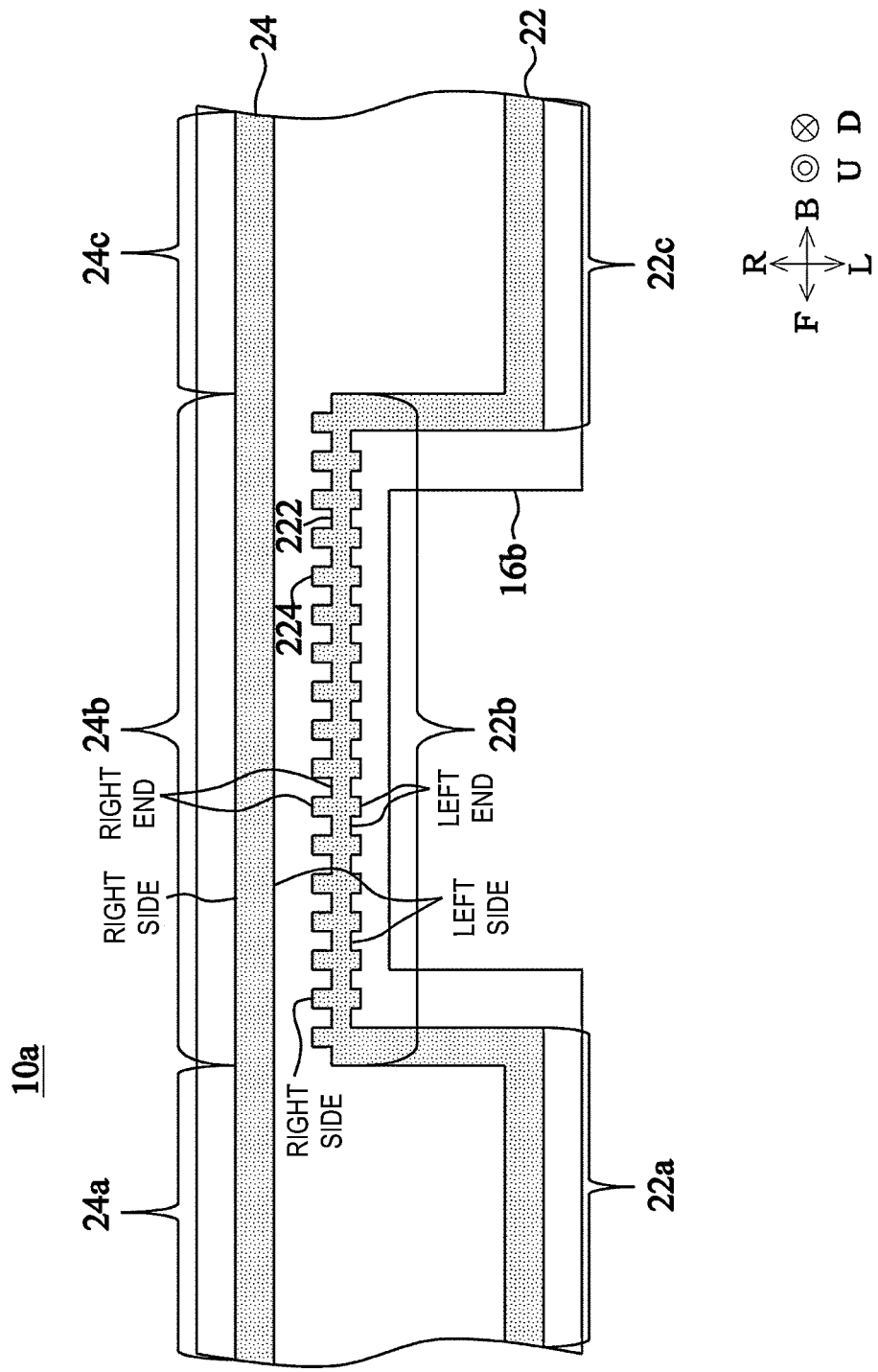
FIG. 4 is a top view of a first signal conductor layer 22, a second signal conductor layer 24, and an insulator layer 16b of a circuit board 10a according to a preferred embodiment of the present invention.

Preferred embodiments of the present invention will be described below with reference to the accompanying drawings.

Preferred Embodiment

Hereinafter, a circuit board 10 according to a preferred embodiment of the present invention will be described with reference to the drawings.

FIG. 1 is an external perspective view of an electronic device 1 including the circuit board 10. In FIG. 1, only a representative electronic component 4 of a plurality of electronic components 4 is denoted by a reference numeral. FIG. 2 is an exploded perspective view of the circuit board 10. FIG. 3 illustrates, in top view, a first signal conductor layer 22, a second signal conductor layer 24, and an insulator layer 16b of the circuit board 10.

In the present description, directions are defined as follows. A stacking direction of a resist layer 17a, an insulator layer 16a, the insulator layer 16b, and a resist layer 17b is defined as an up-down direction. A longitudinal direction of a board body 12 is defined as a front-back direction. A lateral direction of the board body 12 is defined as a left-right direction. The up-down direction, the front-back direction, and the left-right direction are orthogonal or substantially orthogonal to one another. The definitions of the directions in the present description are examples. Thus, the directions regarding the board body 12 when in actual use do not necessarily coincide with the directions given in the present description. In addition, the up-down direction may be inverted in the drawings. Similarly, the left-right direction may be inverted in the drawings. The front-back direction may be inverted in the drawings.

The electronic device 1 is, for example, a portable communication terminal device, such as a smartphone. As FIG. 1 illustrates, the electronic device 1 includes a motherboard 2, a plurality of electronic components 4, and the circuit board 10. The motherboard 2 has a plate shape. Electric circuits are provided at a surface and in an inner portion of the motherboard 2. A plurality of outer electrodes (not illustrated) for mounting the electronic components 4 and the circuit board 10 are provided on an upper main surface of the motherboard 2.

The plurality of electronic components 4 include, for example, a chip electronic component and a semiconductor integrated circuit. The plurality of electronic components 4 are mounted on the upper main surface of the motherboard 2.

The circuit board 10 is a radio-frequency-signal transmission line for electrically connecting two electric circuits, in the electronic device 1. In the present preferred embodiment, the circuit board 10 electrically connects two spots of the motherboard 2. A plurality of outer electrodes (not illustrated) are provided on a front end portion and a rear end portion of a lower main surface of the circuit board 10. Each of the plurality of outer electrodes provided on the front end portion and the rear end portion of the lower main surface of the circuit board 10 is fixed with solder to a corresponding one of the plurality of outer electrodes provided on the upper main surface of the motherboard 2. As FIG. 2 illustrates, the circuit board 10 includes the board body 12, the first signal conductor layer 22, the second signal conductor layer 24, a first ground conductor layer 26, and a second ground conductor layer 28.

The board body 12 has a plate shape. The board body 12 extends in the front-back direction. However, as FIG. 1 and FIG. 2 illustrate, in the left-right direction, the width of an intermediate portion, in the left-right direction, of the board body 12 is narrower than the widths of portions of the board body 12 other than the left-right-direction intermediate portion of the board body 12. Thus, as FIG. 1 illustrates, the circuit board 10 is prevented from being in contact with the electronic component 4.

The board body 12 includes the resist layer 17a, the insulator layers 16a and 16b, and the resist layer 17b that are stacked in the up-down direction. In the present preferred embodiment, the resist layer 17a, the insulator layers 16a and 16b, and the resist layer 17b are stacked in this order from top to bottom. The insulator layers 16a and 16b are prepared by using an insulating material. Examples of the insulating material used for the insulator layers 16a and 16b include insulating resins such as a liquid-crystal polymer (LCP) and polyimide. The resist layers 17a and 17b will be described later. The above-described board body 12 has flexibility. Thus, by bending the board body 12 upward or downward, two substrates can be connected to one another with a connector.

The first signal conductor layer 22 is provided in the board body 12. The first signal conductor layer 22 is provided on an upper main surface of the insulator layer 16b. The first signal conductor layer 22 extends in the front-back direction. Hereinafter, the line width direction of the first signal conductor layer 22 is defined as a signal-conductor-layer left-right direction. In addition, the direction in which the first signal conductor layer 22 extends is defined as a signal-conductor-layer front-back direction. The reason for selectively using the two kinds of directions is described below.

The first signal conductor layer 22 is bent at a right angle at four spots when viewed in the up-down direction. Thus, the first signal conductor layer 22 includes, at two locations, two sections 22d and 22e extending in the left-right direction. In the sections 22d and 22e, the line width direction of the first signal conductor layer 22 is the front-back direction, thereby not coinciding with the left-right direction. Similarly, in the sections 22d and 22e, the extending direction of the first signal conductor layer 22 is the left-right direction, thus not coinciding with the front-back direction. Thus, in the present description, the left-right direction and the signal-conductor-layer left-right direction are selectively used. In addition, the front-back direction and the signal-conductor-layer front-back direction are selectively used.

The first signal conductor layer 22 includes a second section 22a, a first section 22b, and a second section 22c. The first section 22b is an intermediate portion of the first signal conductor layer 22. The intermediate portion of the first signal conductor layer 22 is a portion not including the left end or the right end of the first signal conductor layer 22. The second sections 22a and 22c are sections other than the first section 22b. The second section 22a, the first section 22b, and the second section 22c are arranged in this order from front to back in the signal-conductor-layer front-back direction and connected to one another.

The second signal conductor layer 24 is provided in the board body 12. The second signal conductor layer 24 is provided on the upper main surface of the insulator layer 16b. The second signal conductor layer 24 has a linear shape extending in the left-right direction. The second signal conductor layer 24 is disposed on the right of the first signal conductor layer 22. In the present description, the state in which the second signal conductor layer 24 is disposed on the right of the first signal conductor layer 22 is as follows. At least a portion of the second signal conductor layer 24 is disposed in a region through which the first signal conductor layer 22 passes when translated rightward. Thus, the second signal conductor layer 24 may be within such a region through which the first signal conductor layer 22 passes when translated rightward, or a portion of the second signal conductor layer 24 may extend beyond the region through which the first signal conductor layer 22 passes when translated rightward. Although illustration is omitted, in the present preferred embodiment, the front end of the first signal conductor layer 22 and the front end of the second signal conductor layer 24 overlap one another when viewed in the left-right direction. Similarly, the rear end of the first signal conductor layer 22 and the rear end of the second signal conductor layer 24 overlap one another when viewed in the left-right direction. Thus, no portion of the second signal conductor layer 24 extends beyond the region through which the first signal conductor layer 22 passes when translated rightward. Such a positional relationship between the first and second signal conductor layers 22 and 24 may be applied to the positional relationship between members other than the first signal conductor layer 22 and the second signal conductor layer 24.

The second signal conductor layer 24 includes a fourth section 24a, a third section 24b, and a fourth section 24c. The third section 24b is an intermediate portion of the second signal conductor layer 24. The fourth sections 24a and 24c are sections other than the third section 24b. The fourth section 24a, the third section 24b, and the fourth section 24c are arranged in this order from front to back in the signal-conductor-layer front-back direction and connected to one another.

Here, the first section 22b and the third section 24b will be described in further detail. The first section 22b is disposed on the left of the third section 24b in the signal-conductor-layer left-right direction when viewed in the up-down direction (stacking direction). The first section 22b extends, in parallel or substantially in parallel with the third section 24b, in the signal-conductor-layer front-back direction. In the present preferred embodiment, each of the first section 22b and the third section 24b has a linear shape extending in the left-right direction. Moreover, the first section 22b and the third section 24b are provided on an upper main surface of the insulator layer 16b, thus being disposed at the same position in the up-down direction. Thus, the first section 22b is disposed on the left of the third section 24b. The first section 22b extends, in parallel or substantially in parallel with the third section 24b, in the front-back direction.

Next, a distinction between the first section 22b and the second sections 22a and 22c and a distinction between the third section 24b and the fourth sections 24a and 24c will be described. As FIG. 3 illustrates, a distance d2 between the first section 22b and the third section 24b is shorter than a distance d1 between the second section 22a and the fourth section 24a. As FIG. 3 illustrates, the distance d2 between the first section 22b and the third section 24b is shorter than a distance d3 between the second section 22c and the fourth section 24c. The distance d2 between the first section 22b and the third section 24b is the shortest distance between the first section 22b and the third section 24b.

Thus, in the first signal conductor layer 22, a section whose distance from the second signal conductor layer 24 is relatively short is defined as the first section 22b. More specifically, in the first signal conductor layer 22, a section including a section whose distance from the second signal conductor layer 24 is shortest is defined as the first section 22b. On the other hand, in the first signal conductor layer 22, sections whose distances from the second signal conductor layer 24 are relatively long are defined as the second sections 22a and 22c.

In the present description, the two sections 22*d* and 22*e*, in the first signal conductor layer 22, extending in the left-right direction are portions included in the respective second sections 22*a* and 22*c*.

In addition, in the second signal conductor layer 24, a section whose distance from the first signal conductor layer 22 is relatively short is defined as the third section 24*b*. More specifically, in the second signal conductor layer 24, a section including a section whose distance from the first signal conductor layer 22 is shortest is defined as the third section 24*b*. On the other hand, in the second signal conductor layer 24, sections whose distances from the first signal conductor layer 22 are relatively long are defined as the fourth sections 24*a* and 24*c*.

Next, the structure of the first section 22*b* will be described with reference to FIG. 3. The first section 22*b* includes a plurality of first thin line portions 222 and a plurality of first thick line portions 224. In FIG. 3, only a representative first thin line portion 222 in the plurality of first thin line portions 222 and a representative first thick line portion 224 in the plurality of first thick line portions 224 are denoted by reference numerals. Each of the plurality of first thin line portions 222 has a line width w1, and each of the plurality of first thick line portions 224 has a line width w2 greater than the line width w1. In the signal-conductor-layer front-back direction, the first thin line portion 222 has a length l1 smaller than or equal to a length l2 of the first thick line portion 224. In addition, the plurality of first thin line portions 222 and the plurality of first thick line portions 224 are alternately arranged in the signal-conductor-layer front-back direction. Thus, the line width of the first section 22*b* changes periodically. The total of the length l1 of the first thin line portion 222 and the length l2 of the first thick line portion 224 in the signal-conductor-layer front-back direction is less than or equal to half the wavelength of a radio-frequency signal that is transmitted through the first signal conductor layer 22. That is, the length of the first section 22*b* per period of change in the line width of the first section 22*b* is less than or equal to half the wavelength of a radio-frequency signal that is transmitted through the first signal conductor layer 22.

In addition, the left ends of the plurality of first thin line portions 222 coincide with the left ends of the plurality of first thick line portions 224 in the signal-conductor-layer left-right direction. Thus, the left edge of the first section 22*b* is even. In the present preferred embodiment, the left edge of the first section 22*b* has a linear shape extending in the front-back direction. On the other hand, the right ends of the plurality of first thin line portions 222 are positioned leftward relative to the right ends of the plurality of first thick line portions 224 in the signal-conductor-layer left-right direction. Thus, the right edge of the first section 22*b* is uneven. The right edge of the first section 22*b* has a zigzag shape (whose turns are not necessarily sharp) extending in the left-right direction. As a result, in the signal-conductor-layer left-right direction, center lines L1 of the plural first thin line portions 222 are positioned leftward relative to center lines L2 of the plurality of first thick line portions 224. Thus, a center line La of the first section 22*b* in the signal-conductor-layer left-right direction has a zigzag shape extending in the left-right direction.

The line width of the third section 24*b* is uniform. Thus, each of the left edge and the right edge of the third section 24*b* has a linear shape extending in the left-right direction.

As described above, in the left-right direction, the width of the intermediate portion, in the left-right direction, of the board body 12 is narrower than the widths of portions of the board body 12 other than the left-right-direction intermediate portion of the board body 12 as FIG. 3 illustrates. More specifically, in the signal-conductor-layer left-right direction, a width W2 of the board body 12 in the first section 22*b* is narrower than a width W1 and a width W3 of the board body 12 in the respective second sections 22*a* and 22*c*. However, in the signal-conductor-layer left-right direction, the width of a portion, of the board body 12, including a front end portion of the first section 22*b* is the width W1 greater than the width W2. Similarly, in the signal-conductor-layer left-right direction, the width of a portion, of the board body 12, including a rear end portion of the first section 22*b* is the width W3 greater than the width W2.

The first ground conductor layer 26 is provided on the upper main surface of the insulator layer 16*a*. The first ground conductor layer 26 has a planar shape. The first ground conductor layer 26 covers the entire or substantially the entire upper main surface of the insulator layer 16*a*. Thus, the first ground conductor layer 26 is disposed above the first signal conductor layer 22 and the second signal conductor layer 24. In addition, the first ground conductor layer 26 overlaps the first signal conductor layer 22 and the second signal conductor layer 24 when viewed in the up-down direction.

The second ground conductor layer 28 is provided on a lower main surface of the insulator layer 16*b*. The second ground conductor layer 28 has a planar shape. The second ground conductor layer 28 covers the entire or substantially the entire lower main surface of the insulator layer 16*b*. Thus, the second ground conductor layer 28 is disposed below the first signal conductor layer 22 and the second signal conductor layer 24. In addition, the second ground conductor layer 28 overlaps the first signal conductor layer 22 and the second signal conductor layer 24 when viewed in the up-down direction. The first signal conductor layer 22, the second signal conductor layer 24, the first ground conductor layer 26, and the second ground conductor layer 28 that are described above define a strip-line structure. The first signal conductor layer 22, the second signal conductor layer 24, the first ground conductor layer 26, and the second ground conductor layer 28 are made of, for example, metal foil such as copper foil that is subjected to patterning.

The resist layer 17*a* covers the first ground conductor layer 26. The resist layer 17*a* defines and functions as a protective layer for the first ground conductor layer 26. The resist layer 17*b* covers the second ground conductor layer 28. The resist layer 17*b* defines and functions as a protective layer for the second ground conductor layer 28. The resist layers 17*a* and 17*b* are prepared by, for example, printing an insulating material.

The circuit board 10 includes a via hole conductor and an outer electrode, which are not illustrated. Such a via hole conductor defines and functions as an interlayer connection conductor electrically connecting the first ground conductor layer 26 and the second ground conductor layer 28 to one another. In addition, a via hole conductor defines and functions as an interlayer connection conductor electrically connecting the first signal conductor layer 22 and an outer electrode to one another. Moreover, a via hole conductor defines and functions as an interlayer connection conductor electrically connecting the second signal conductor layer 24 and an outer electrode to one another. However, because the via hole conductors and the outer electrodes of the circuit board 10 have typical structures, the description thereof are thus omitted.

Advantageous Effects

With the circuit board 10, the first signal conductor layer 22 and the second signal conductor layer 24 can be prevented from being coupled to one another even when the distance between the first signal conductor layer 22 and the second signal conductor layer 24 is reduced. More specifically, as FIG. 1 illustrates, there may be an intention to prevent the circuit board 10 from being in contact with the electronic component 4. In such a case, in the left-right direction, the width of the intermediate portion, in the left-right direction, of the board body 12 is narrower than the widths of portions of the board body 12 other than the left-right-direction intermediate portion of the board body 12. Thus, the distance between the first signal conductor layer 22 and the second signal conductor layer 24 is reduced in the intermediate portion, in the left-right-direction, of the board body 12. That is, the first section 22b and the third section 24b extend in the signal-conductor-layer front-back direction in parallel or substantially in parallel with one another in the intermediate portion, in the left-right-direction, of the board body 12. In this case, the first section 22b and the third section 24b are likely to be coupled to one another. Thus, the degree of isolation between the first signal conductor layer 22 and the second signal conductor layer 24 is likely to be reduced.

Thus, the first section 22b includes the plurality of first thin line portions 222 having the line width w1 and the plurality of first thick line portions 224 having the line width w2 greater than the line width w1. The plurality of first thin line portions 222 and the plurality of first thick line portions 224 are alternately arranged in the signal-conductor-layer front-back direction. In the signal-conductor-layer left-right direction, the center lines L1 of the plurality of first thin line portions 222 are positioned leftward relative to the center lines L2 of the plurality of first thick line portions 224. Thus, a distance d4 between the first thin line portion 222 and the third section 24b is greater than the distance d2 between the first thick line portion 224 and the third section 24b. As a result, the average of the distances between the first section 22b and the third section 24b is greater than the distance d2. The first section 22b and the third section 24b are prevented from being coupled to one another. As described above, with the circuit board 10, the first signal conductor layer 22 and the second signal conductor layer 24 can be prevented from being coupled to one another even when the distance between the first signal conductor layer 22 and the second signal conductor layer 24 is reduced.

In addition, with the circuit board 10, the insertion loss of the first signal conductor layer 22 can be reduced or prevented from increasing. More specifically, for example, the line width of the first signal conductor layer 22 in the entire first section 22b may be reduced to prevent the first signal conductor layer 22 and the second signal conductor layer 24 from being coupled to one another. Consequently, the distance between the first section 22b and the third section 24b can be increased. However, the insertion loss of the first signal conductor layer 22 increases. Thus, in the circuit board 10, the first section 22b includes the plurality of first thin line portions 222 having the line width w1 and the plurality of first thick line portions 224 having the line width w2 greater than the line width w1. Accordingly, with the circuit board 10, the insertion loss of the first signal conductor layer 22 is reduced or prevented from increasing.

In addition, according to the circuit board 10, the total of the length l1 of the first thin line portion 222 and the length l2 of the first thick line portion 224 in the signal-conductor-layer front-back direction is less than or equal to half the wavelength of a radio-frequency signal that is transmitted through the first signal conductor layer 22. Thus, degradation of the characteristics of the circuit board 10 due to generation of a standing wave in the first thin line portions 222 and the first thick line portions 224 are reduced or prevented from occurring. As a result, the transmission quality of the first signal conductor layer 22 can be reduced or prevented from being degraded.

In addition, according to the circuit board 10, in the signal-conductor-layer front-back direction, the first thin line portion 222 has the length l1 smaller than or equal to the length l2 of the first thick line portion 224. In particular, in the signal-conductor-layer front-back direction, the length l1 of the first thin line portion 222 is preferably equal or substantially equal to the length l2 of the first thick line portion 224. Due to the configuration, the proportion of the first thick line portions 224 to the first section 22b increases. As a result, the first signal conductor layer 22 and the second signal conductor layer 24 can be prevented from being coupled to one another while the insertion loss of the first signal conductor layer 22 is reduced or prevented from increasing.

First Modification

Hereinafter, a circuit board 10a according to a first modification of a preferred embodiment of the present invention will be described with reference to the drawings. FIG. 4 is a top view of a first signal conductor layer 22, a second signal conductor layer 24, and an insulator layer 16b of the circuit board 10a.

The circuit board 10a differs from the circuit board 10 in the shape of the first section 22b. In the circuit board 10, the left edge of the first section 22b has a linear shape extending in the left-right direction. On the other hand, in the circuit board 10a, the left edge of a first section 22b has a zigzag shape extending in the left-right direction. That is, the left ends of the plurality of first thin line portions 222 are positioned rightward relative to the left ends of the plurality of first thick line portions 224 in the signal-conductor-layer left-right direction. The structures of the other portions of the circuit board 10a are the same or substantially the same as those of the circuit board 10, and the descriptions thereof are thus omitted.

In the signal-conductor-layer left-right direction, the first thick line portions 224 of the circuit board 10a have a line width greater than the line width of the first thick line portions 224 of the circuit board 10. Thus, in the circuit board 10a, the insertion loss of the first signal conductor layer 22 is further reduced or prevented from increasing compared with the circuit board 10. In addition, in the circuit board 10a, both the left edge and the right edge of the first section 22b have a zigzag shape. Accordingly, with the circuit board 10a, the first section 22b can be prevented from being coupled to a circuit, a component, a housing, or other portions that are positioned on the right of the first section 22b.

Second Modification

Figure 5:
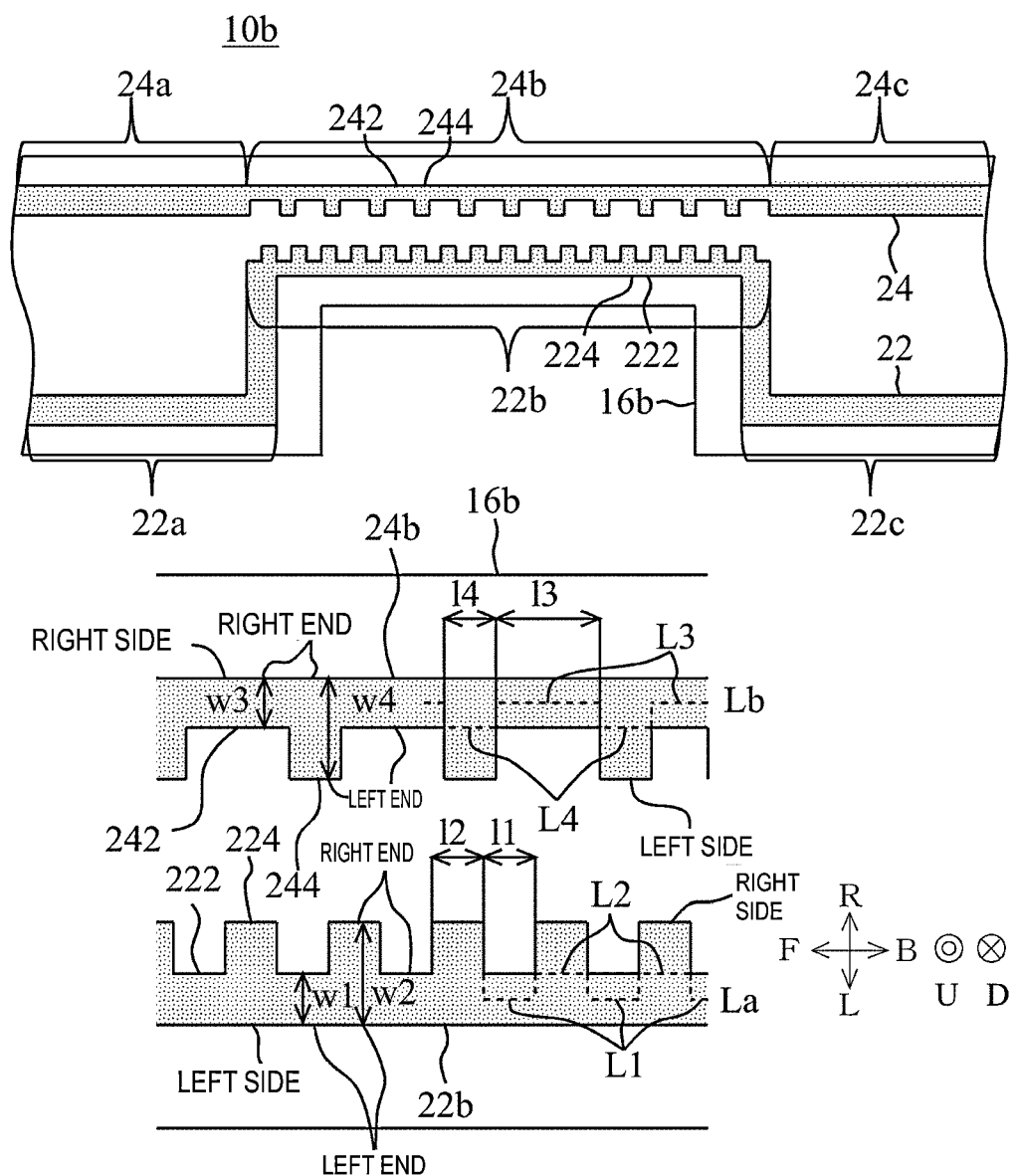
FIG. 5 illustrates, in top view, a first signal conductor layer 22, a second signal conductor layer 24, and an insulator layer 16b of a circuit board 10b according to a preferred embodiment of the present invention.

Hereinafter, a circuit board 10b according to a second modification of a preferred embodiment of the present invention will be described with reference to the drawings. FIG. 5 illustrates, in top view, a first signal conductor layer 22, a second signal conductor layer 24, and an insulator layer 16b of the circuit board 10b.

The circuit board 10b differs from the circuit board 10 in the shape of the third section 24b. In the circuit board 10, the left edge of the third section 24b has a linear shape extending in the left-right direction. On the other hand, in the circuit board 10b, the left edge of a third section 24b has a zigzag shape extending in the left-right direction.

Next, the structure of the third section 24b will be described with reference to FIG. 5. The third section 24b includes a plurality of second thin line portions 242 and a plurality of second thick line portions 244. Each of the plurality of second thin line portions 242 has a line width w3, and each of the plurality of second thick line portions 244 has a line width w4 greater than the line width w3. In addition, the plurality of second thin line portions 242 and the plurality of second thick line portions 244 are alternately arranged in the signal-conductor-layer front-back direction. Thus, the line width of the third section 24b changes periodically. The total of a length l3 of the second thin line portion 242 and a length l4 of the second thick line portion 244 in the signal-conductor-layer front-back direction is less than or equal to half the wavelength of a radio-frequency signal that is transmitted through the second signal conductor layer 24. That is, the length of the third section 24b per period of change in the line width of the third section 24b is less than or equal to half the wavelength of a radio-frequency signal that is transmitted through the second signal conductor layer 24.

In addition, the right ends of the plurality second thin line portions 242 coincide with the right ends of the plurality second thick line portions 244 in the signal-conductor-layer left-right direction. Thus, the right edge of the third section 24b is even. In the present preferred embodiment, the right edge of the third section 24b has a linear shape extending in the left-right direction. On the other hand, the left ends of the plurality of second thin line portions 242 are positioned rightward relative to the left ends of the plurality of second thick line portions 244 in the signal-conductor-layer left-right direction. Thus, the left edge of the third section 24b is uneven. The left edge of the third section 24b has a zigzag shape extending in the front-back direction. As a result, in the signal-conductor-layer left-right direction, center lines L3 of the plurality of second thin line portions 242 are positioned rightward relative to center lines L4 of the plurality of second thick line portions 244. Thus, a center line Lb of the third section 24b in the signal-conductor-layer left-right direction has a zigzag shape extending in the left-right direction.

In addition, the total of a length l1 of a first thin line portion 222 and a length of l2 of a first thick line portion 224, in the signal-conductor-layer front-back direction, differs from the total of the length l3 of the second thin line portion 242 and the length l4 of the second thick line portion 244, in the signal-conductor-layer front-back direction. In the present preferred embodiment, the total of the length l1 of the first thin line portion 222 and the length of l2 of the first thick line portion 224 in the signal-conductor-layer front-back direction is smaller than the total of the length l3 of the second thin line portion 242 and the length l4 of the second thick line portion 244 in the signal-conductor-layer front-back direction. This is because the wavelength of a radio-frequency signal that is transmitted through the first signal conductor layer 22 is smaller than the wavelength of a radio-frequency signal that is transmitted through the second signal conductor layer 24. That is, when the frequency of a radio-frequency signal that is transmitted through the first signal conductor layer 22 differs from the frequency of a radio-frequency signal that is transmitted through the second signal conductor layer 24, the periodic zigzag pattern of the first section 22b differs from that of the third section 24b.

With the circuit board 10b, the first signal conductor layer 22 and the second signal conductor layer 24 can further be prevented from being coupled to one another. More specifically, the third section 24b includes the plurality of second thin line portions 242 having the line width w3 and the plurality of second thick line portions 244 having the line width w4 greater than the line width w3. The plurality of second thin line portions 242 and the plurality of second thick line portions 244 are alternately arranged in the signal-conductor-layer front-back direction. In the signal-conductor-layer left-right direction, the center lines L3 of the plurality of second thin line portions 242 are positioned rightward relative to the center lines L4 of the plurality of second thick line portions 244. Thus, the average of the distances between the first section 22b and the third section 24b in the circuit board 10b is greater than the average of the distances between the first section 22b and the third section 24b in the circuit board 10. As a result, the first section 22b and the third section 24b are further prevented from being coupled to one another.

Third Modification

Hereinafter, a circuit board 10c according to a third modification of a preferred embodiment of the present invention will be described with reference to the drawings. FIG. 6 illustrates, in top view, a first signal conductor layer 22, a second signal conductor layer 24, a third signal conductor layer 32, and an insulator layer 16b of the circuit board 10c.

The circuit board 10c differs from the circuit board 10b in the shape of the third section 24b and the presence or absence of the third signal conductor layer 32. Hereinafter, such differences will be described.

In the circuit board 10b, the right edge of the third section 24b has a linear shape extending in the left-right direction. On the other hand, in the circuit board 10c, the right edge of a third section 24b has a zigzag shape extending in the left-right direction. That is, the right ends of the plurality of second thin line portions 242 are positioned leftward relative to the right ends of the plurality of second thick line portions 244 in the signal-conductor-layer left-right direction.

The circuit board 10c further includes the third signal conductor layer 32. The third signal conductor layer 32 includes a sixth section 32a, a fifth section 32b, and a sixth section 32c. The fifth section 32b is an intermediate portion of the third signal conductor layer 32. The sixth sections 32a and 32c are sections other than the fifth section 32b. The sixth section 32a, the fifth section 32b, and the sixth section 32c are arranged in this order from front to back in the signal-conductor-layer front-back direction and connected to one another. The fifth section 32b is disposed on the right of the third section 24b in the signal-conductor-layer left-right direction when viewed in the up-down direction (stacking direction). The fifth section 32b extends, in parallel or substantially in parallel with the third section 24b, in the signal-conductor-layer front-back direction.

Next, the structure of the fifth section 32b will be described with reference to FIG. 6. The fifth section 32b includes a plurality of third thin line portions 322 and a plurality of third thick line portions 324. Each of the plurality of third thin line portions 322 has a line width w5, and each of the plurality of third thick line portions 324 has a line width w6 greater than the line width w5. In addition, the plurality of third thin line portions 322 and the plurality of third thick line portions 324 are alternately arranged in the signal-conductor-layer front-back direction. Thus, the line width of the fifth section 32b changes periodically. The total of a length l5 of the third thin line portion 322 and a length l6 of the third thick line portion 324 in the signal-conductor-layer front-back direction is less than or equal to half the wavelength of a radio-frequency signal that is transmitted through the third signal conductor layer 32. That is, the length of the fifth section 32b per period of change in the line width of the fifth section 32b is less than or equal to half the wavelength of a radio-frequency signal that is transmitted through the third signal conductor layer 32.

In addition, the right ends of the plurality of third thin line portions 322 coincide with the right ends of the plurality of third thick line portions 324 in the signal-conductor-layer left-right direction. Thus, the right edge of the fifth section 32b is even. In the present preferred embodiment, the right edge of the fifth section 32b has a linear shape extending in the left-right direction. On the other hand, the left ends of the plurality of third thin line portions 322 are positioned rightward relative to the left ends of the plurality of third thick line portions 324 in the signal-conductor-layer left-right direction. Thus, the left edge of the fifth section 32b is uneven. The left edge of the fifth section 32b has a zigzag shape extending in the left-right direction. As a result, in the signal-conductor-layer left-right direction, center lines L5 of the plurality of third thin line portions 322 are positioned rightward relative to center lines L6 of the plurality of third thick line portions 324. Thus, a center line Lc of the fifth section 32b in the signal-conductor-layer left-right direction has a zigzag shape extending in the left-right direction. The structures of the other portions of the circuit board 10c are the same or substantially the same as those of the circuit board 10b, and the descriptions thereof are thus omitted.

With the circuit board 10c, the first signal conductor layer 22 and the second signal conductor layer 24 can be prevented from being coupled to one another, and the second signal conductor layer 24 and the third signal conductor layer 32 can also be prevented from being coupled to one another.

Fourth Modification

Hereinafter, a circuit board 10d according to a fourth modification of a preferred embodiment of the present invention will be described with reference to the drawings. FIG. 7 is a top view of a first signal conductor layer 22, a second signal conductor layer 24, a third signal conductor layer 32, a fourth signal conductor layer 34, and an insulator layer 16b of the circuit board 10d.

The circuit board 10d differs from the circuit board 10b in the presence or absence of the third signal conductor layer 32 and the fourth signal conductor layer 34. More specifically, the circuit board 10d further includes the third signal conductor layer 32 and the fourth signal conductor layer 34. In addition, first differential signals are transmitted to the first signal conductor layer 22 and the fourth signal conductor layer 34. Second differential signals are transmitted to the second signal conductor layer 24 and the third signal conductor layer 32.

The fourth signal conductor layer 34 is provided in the board body 12. The fourth signal conductor layer 34 is disposed on the left of the first signal conductor layer 22. The fourth signal conductor layer 34 and the first signal conductor layer 22 are symmetrical or substantially symmetrical on the left and right sides. More specifically, the fourth signal conductor layer 34 includes an eighth section 34a (not illustrated), a seventh section 34b, and an eighth section 34c (not illustrated). The seventh section 34b is an intermediate portion of the fourth signal conductor layer 34. The eighth sections 34a and 34c are sections other than the seventh section 34b. The eighth section 34a, the seventh section 34b, and the eighth section 34c are arranged in this order from front to back in the signal-conductor-layer front-back direction and connected to one another. The seventh section 34b is disposed on the left of a first section 22b in the signal-conductor-layer left-right direction when viewed in the up-down direction (stacking direction). The seventh section 34b extends, in parallel or substantially in parallel with the first section 22b, in the signal-conductor-layer front-back direction.

Next, the structure of the seventh section 34b will be described with reference to FIG. 7. The seventh section 34b includes a plurality of fourth thin line portions 342 and a plurality of fourth thick line portions 344. Each of the plurality of fourth thin line portions 342 has a line width w7, and each of the plurality of fourth thick line portions 344 has a line width w8 greater than the line width w7. In addition, the plurality of fourth thin line portions 342 and the plurality of fourth thick line portions 344 are alternately arranged in the signal-conductor-layer front-back direction. Thus, the line width of the seventh section 34b changes periodically. The total of a length 17 of the fourth thin line portion 342 and a length 18 of the fourth thick line portion 344 in the signal-conductor-layer front-back direction is less than or equal to half the wavelength of a radio-frequency signal that is transmitted through the fourth signal conductor layer 34. That is, the length of the seventh section 34b per period of change in the line width of the seventh section 34b is less than or equal to half the wavelength of a radio-frequency signal that is transmitted through the fourth signal conductor layer 34. In addition, the total of a length of a first thin line portion 222 and a length of a first thick line portion 224 in the signal-conductor-layer front-back direction is equal or substantially equal to the total of a length of the fourth thin line portion 342 and a length of the fourth thick line portion 344 in the signal-conductor-layer front-back direction.

In addition, the right ends of the plurality of fourth thin line portions 342 coincide with the right ends of the plurality of fourth thick line portions 344 in the signal-conductor-layer left-right direction. Thus, the right edge of the seventh section 34b is even. In the present preferred embodiment, the right edge of the seventh section 34b has a linear shape extending in the left-right direction. On the other hand, the left ends of the plurality of fourth thin line portions 342 are positioned rightward relative to the left ends of the plurality of fourth thick line portions 344 in the signal-conductor-layer left-right direction. Thus, the left edge of the seventh section 34b is uneven. The left edge of the seventh section 34b has a zigzag shape extending in the left-right direction. As a result, in the signal-conductor-layer left-right direction, center lines L7 of the plurality of fourth thin line portions 342 are positioned rightward relative to center lines L8 of the plurality of fourth thick line portions 344. Thus, a center line Ld of the seventh section 34b in the signal-conductor-layer left-right direction has a zigzag shape extending in the left-right direction.

The third signal conductor layer 32 is provided in the board body 12. The third signal conductor layer 32 is disposed on the right of the second signal conductor layer 24. The third signal conductor layer 32 includes a sixth section 32a (not illustrated), a fifth section 32b, and a sixth section 32c (not illustrated). The fifth section 32b is an intermediate portion of the third signal conductor layer 32. The sixth sections 32a and 32c are sections other than the fifth section 32b. The sixth section 32a, the fifth section 32b, and the sixth section 32c are arranged in this order from front to back in the signal-conductor-layer front-back direction and connected to one another. The fifth section 32b is disposed on the right of a third section 24b in the signal-conductor-layer left-right direction when viewed in the up-down direction (stacking direction). The fifth section 32b extends, in parallel or substantially in parallel with the third section 24b, in the signal-conductor-layer front-back direction.

Next, the structure of the fifth section 32b will be described with reference to FIG. 7. The fifth section 32b includes a plurality of third thin line portions 322 and a plurality of third thick line portions 324. Each of the plurality of third thin line portions 322 has a line width w5, and each of the plurality of third thick line portions 324 has a line width w6 greater than the line width w5. In addition, the plurality of third thin line portions 322 and the plurality of third thick line portions 324 are alternately arranged in the signal-conductor-layer front-back direction. Thus, the line width of the fifth section 32b changes periodically. The total of a length l5 of the third thin line portion 322 and a length l6 of the third thick line portion 324 in the signal-conductor-layer front-back direction is less than or equal to half the wavelength of a radio-frequency signal that is transmitted through the third signal conductor layer 32. That is, the length of the fifth section 32b per period of change in the line width of the fifth section 32b is less than or equal to half the wavelength of a radio-frequency signal that is transmitted through the third signal conductor layer 32. In addition, the total of a length of the second thin line portion 242 and a length of the second thick line portion 244 in the signal-conductor-layer front-back direction is equal or substantially equal to the total of a length of the third thin line portion 322 and a length of the third thick line portion 324 in the signal-conductor-layer front-back direction.

In addition, the left ends of the plurality of third thin line portions 322 coincide with the left ends of the plurality of third thick line portions 324 in the signal-conductor-layer left-right direction. Thus, the left edge of the fifth section 32b is even. In the present preferred embodiment, the left edge of the fifth section 32b has a linear shape extending in the left-right direction. On the other hand, the right ends of the plurality of third thin line portions 322 are positioned leftward relative to the right ends of the plurality of third thick line portions 324 in the signal-conductor-layer left-right direction. Thus, the right edge of the fifth section 32b is uneven. The right edge of the fifth section 32b has a zigzag shape extending in the left-right direction. As a result, in the signal-conductor-layer left-right direction, center lines L5 of the plurality of third thin line portions 322 are positioned leftward relative to center lines L6 of the plurality of third thick line portions 324. Thus, a center line Lc of the fifth section 32b in the signal-conductor-layer left-right direction has a zigzag shape extending in the left-right direction. The structures of the other portions of the circuit board 10d are the same or substantially the same as those of the circuit board 10b, and the descriptions thereof are thus omitted.

In the above-described circuit board 10d, the first signal conductor layer 22 and the second signal conductor layer 24 can be prevented from being coupled to one another.

In addition, the fourth signal conductor layer 34 and the first signal conductor layer 22 are symmetrical or substantially symmetrical on the left and right sides. Thus, the radio-frequency-signal transmission characteristics of the first signal conductor layer 22 are the same as or similar to those of the fourth signal conductor layer 34. Accordingly, the first differential signals can be transmitted to the first signal conductor layer 22 and the fourth signal conductor layer 34. Due to the same or similar reason, the second differential signals can be transmitted to the second signal conductor layer 24 and the third signal conductor layer 32.

Fifth Modification

Figure 8:
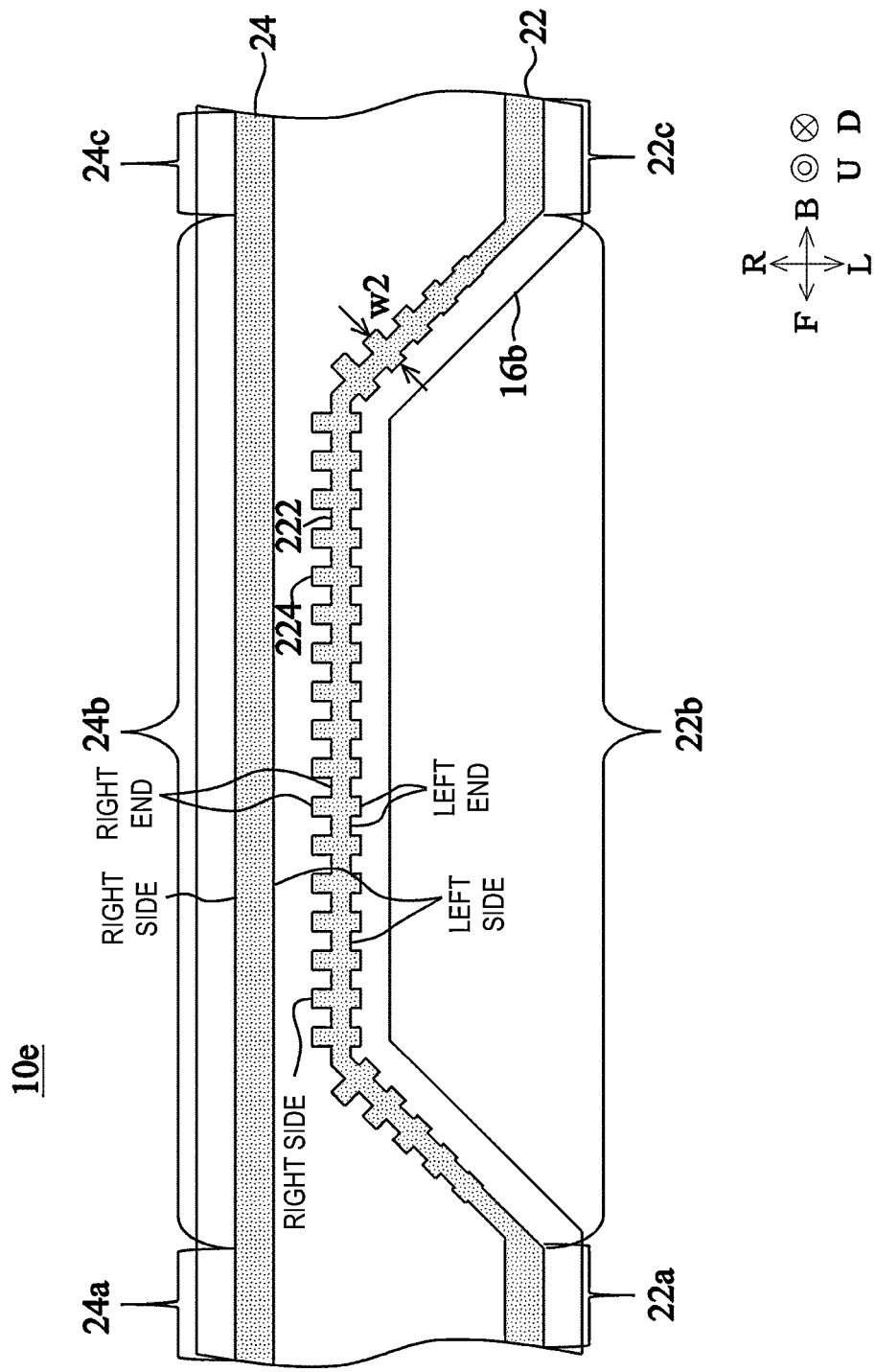
FIG. 8 is a top view of a first signal conductor layer 22, a second signal conductor layer 24, and an insulator layer 16b of a circuit board 10e according to a preferred embodiment of the present invention.

Hereinafter, a circuit board 10e according to a fifth modification of a preferred embodiment of the present invention will be described with reference to the drawings. FIG. 8 is a top view of a first signal conductor layer 22, a second signal conductor layer 24, and an insulator layer 16b of the circuit board 10e.

The circuit board 10e differs from the circuit board 10 in the structures of the plurality of first thick line portions 224. A line width w2 of first thick line portions 224 becomes narrower approaching both ends (the front end and the rear end) of a first section 22b. The structures of the other portions of the circuit board 10e are the same or substantially the same as those of the circuit board 10, and the descriptions thereof are thus omitted.

With the circuit board 10e, the characteristic impedance generated in the first signal conductor layer 22 is reduced or prevented from changing abruptly. As a result, in the first signal conductor layer 22, a radio-frequency signal is reduced or prevented from being reflected, and the insertion loss of the first signal conductor layer 22 is reduced.

Other Preferred Embodiments

The circuit boards according to preferred embodiments of the present invention are not limited to any one of the circuit boards 10 and 10a to 10e and can be changed without departing from the spirit of the present invention. In addition, any of the configurations of the circuit boards 10 and 10a to 10e may be combined.

In the circuit boards 10 and 10a to 10e, the first signal conductor layer 22, the second signal conductor layer 24, the third signal conductor layer 32, and the fourth signal conductor layer 34 may be bent in the left-right direction when viewed in the up-down direction.

In the circuit boards 10 and 10a to 10e, in the signal-conductor-layer left-right direction, the width of the board body 12 in the first section 22b may be greater than or equal to the widths of the board body 12 in the second sections 22a and 22c.

In the circuit boards 10 and 10a to 10e, the total of the length l1 of the first thin line portion 222 and the length l2 of the first thick line portion 224 in the signal-conductor-layer front-back direction is preferably less than or equal to half the wavelength of a radio-frequency signal that is transmitted through the first signal conductor layer 22. However, the total of the length l1 of the first thin line portion 222 and the length l2 of the first thick line portion 224 in the signal-conductor-layer front-back direction may be greater than half the wavelength of a radio-frequency signal that is transmitted through the first signal conductor layer 22.

In the circuit boards 10 and 10a to 10e, in the signal-conductor-layer front-back direction, the length l1 of the first thin line portion 222 is preferably smaller than or equal to the length l2 of the first thick line portion 224. However, in the signal-conductor-layer front-back direction, the length l1 of the first thin line portion 222 may be greater than the length l2 of the first thick line portion 224.

In the circuit boards 10 and 10a to 10e, the first ground conductor layer 26 and the second ground conductor layer 28 are not necessarily provided. Thus, the circuit boards 10 and 10a to 10e do not necessarily include the first ground conductor layer 26 or the second ground conductor layer 28 or do not necessarily include one of the first ground conductor layer 26 and the second ground conductor layer 28. In the case in which the circuit boards 10 and 10a to 10e do not include the first ground conductor layer 26 or the second ground conductor layer 28, the first section 22b and the third section 24b do not overlap a ground conductor layer when viewed in the up-down direction (stacking direction). The structure of the first section 22b in this case will be described with reference to the drawings. Each of FIG. 9 and FIG. 10 is an enlarged view of a first signal conductor layer 22 of a circuit board according to a preferred embodiment of the present invention.

As FIG. 9 illustrates, a line width w2 of a first thick line portion 224 is preferably less than or equal to twice of a distance d10 between the right end of the first thick line portion 224 and the right end of a first thin line portion 222 in the signal-conductor-layer left-right direction. That is, the depth (distance d10) of a recess defined by the first thin line portion 222 and the first thick line portions 224 is preferably greater than or equal to half the line width w2 of the first thick line portion 224. Due to the configuration, unnecessary radiation from the first signal conductor layer 22 can be reduced or prevented.

The first thick line portion 224 may be tapered as FIG. 10 illustrates. In such a case, a length l1 of the first thin line portion 222 is the average of a length l11 and a length l12. In addition, the distance d10 and the widths w1 and w2 are as illustrated in FIG. 10. As described above, with the first signal conductor layer 22 having any one of the structures illustrated in FIG. 9 and FIG. 10, unnecessary radiation from the first signal conductor layer 22 can be reduced or prevented. Thus, when including the first signal conductor layer 22 having any one of the structures illustrated in FIG. 9 and FIG. 10, the circuit boards 10 and 10a to 10e do not necessarily include the first ground conductor layer 26 or the second ground conductor layer 28.

In the circuit boards 10 and 10a to 10e, the positions of the first signal conductor layer 22 and the second signal conductor layer 24 in the up-down direction may differ from one another. Thus, the first signal conductor layer 22 and the second signal conductor layer 24 may be provided on different insulator layers.

In the circuit boards 10 and 10a to 10e, the first section 22b and the third section 24b have been described as the intermediate portions of the first signal conductor layer 22 and the second signal conductor layer 24, respectively. However, the first section 22b may be a portion other than the intermediate portion of the first signal conductor layer 22, and the third section 24b may be a portion other than the intermediate portion of the second signal conductor layer 24. For example, the first section 22b may include a left end portion or a right end portion of the first signal conductor layer 22, and the third section 24b may include a left end portion or a right end portion of the second signal conductor layer 24.

The left edge and/or the right edge of the third section 24b of the circuit board 10c does not necessarily have a zigzag shape.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit board comprising:
   a board body including a plurality of insulator layers that are stacked;
   a first signal conductor layer in the board body and including a first section; and
   a second signal conductor layer in the board body and including a third section; wherein
   a line width direction of the first signal conductor layer is defined as a signal-conductor-layer left-right direction;
   a direction in which the first signal conductor layer extends is defined as a signal-conductor-layer front-back direction;
   when viewed in a stacking direction of the plurality of insulator layers, the first section is positioned leftward of the third section in the signal-conductor-layer left-right direction and extends in parallel or substantially in parallel with the third section in the signal-conductor-layer front-back direction;
   the first section includes a plurality of first thin line portions and a plurality of first thick line portions, each of the plurality of first thick line portions having a line width greater than a line width of each of the plurality of first thin line portion;
   the plurality of first thin line portions and the plurality of first thick line portions are alternately arranged in the signal-conductor-layer front-back direction; and
   a distance between the plurality of thin portions and the third section is greater than a distance between the plurality of thick portions and the third section.

2. The circuit board according to claim 1, wherein
   the first signal conductor layer includes a second section other than the first section in the first signal conductor layer;
   the second signal conductor layer includes a fourth section other than the third section in the second signal conductor layer; and
   a distance between the first section and the third section is shorter than a distance between the second section and the fourth section.

3. The circuit board according to claim 2, wherein, in the signal-conductor-layer left-right direction, a width of a portion of the board body, including the first section is narrower than a width of a portion of the board body including the second section.

4. The circuit board according to claim 1, wherein a total of a length of one of the plurality of first thin line portions and a length of one of the plurality of first thick line portions in the signal-conductor-layer front-back direction is less than or equal to half a wavelength of a radio-frequency signal that is transmitted through the first signal conductor layer.

5. The circuit board according to claim 1, wherein, in the signal-conductor-layer front-back direction, a length of each of the plurality of first thin line portions is smaller than or equal to a length of each of the plurality of first thick line portions.

6. The circuit board according to claim 1, wherein
   when viewed in the stacking direction, the first section and the third section do not overlap a ground conductor layer; and
   the line width of each of the plurality of first thick line portions is less than or equal to twice a distance between a right end of each of the plurality of first thick line portions and a right end of each of the plurality of first thin line portion in the signal-conductor-layer left-right direction.

7. The circuit board according to claim 1, wherein
   the third section includes a plurality of second thin line portions and a plurality of second thick line portions, each of the plurality of second thick line portions having a line width greater than a line width of each of the plurality of second thin line portions;
   the plurality of second thin line portions and the plurality of second thick line portions are alternately arranged in the signal-conductor-layer front-back direction; and in the signal-conductor-layer left-right direction, center lines of the plurality of second thin line portions are positioned rightward relative to center lines of the plurality of second thick line portions.

8. The circuit board according to claim 7, wherein a total of a length of one of the plurality of first thin line portions and a length of one of the plurality of first thick line portions in the signal-conductor-layer front-back direction differs from a total of a length of one of the plurality of second thin line portions and a length of one of the plurality of second thick line portions in the signal-conductor-layer front-back direction.

9. The circuit board according to claim 1, further comprising:
a third signal conductor layer in the board body and including a fifth section; wherein
the third section includes a plurality of second thin line portions and a plurality of second thick line portions, each of the plurality of second thick line portions having a line width greater than a line width of each of the plurality of second thin line portions;
the plurality of second thin line portions and the plurality of second thick line portions are alternately arranged in the signal-conductor-layer front-back direction;
when viewed in the stacking direction, the fifth section is positioned rightward of the third section in the signal-conductor-layer left-right direction and extends in parallel or substantially in parallel with the third section in the signal-conductor-layer front-back direction;
the fifth section includes a plurality of third thin line portions and a plurality of third thick line portions, each of the plurality of third thick line portions having a line width greater than a line width of each of the plurality of third thin line portions;
the plurality of third thin line portions and the plurality of third thick line portions are alternately arranged in the signal-conductor-layer front-back direction; and
in the signal-conductor-layer left-right direction, center lines of the plurality of third thin line portions are positioned rightward relative to center lines of the plurality of third thick line portions.

10. The circuit board according to claim 1, further comprising:
a third signal conductor layer in the board body and including a fifth section; and
a fourth signal conductor layer in the board body and including a seventh section; wherein
the third section includes a plurality of second thin line portions and a plurality of second thick line portions, each of the plurality of second thick line portions having a line width greater than a line width of each of the plurality of second thin line portions;
the plurality of second thin line portions and the plurality of second thick line portions are alternately arranged in the signal-conductor-layer front-back direction;
in the signal-conductor-layer left-right direction, center lines of the plurality of second thin line portions are positioned rightward relative to center lines of the plurality of second thick line portions;
when viewed in the stacking direction, the fifth section is positioned rightward of the third section in the signal-conductor-layer left-right direction and extends in parallel or substantially in parallel with the third section in the signal-conductor-layer front-back direction;
the fifth section includes a plurality of third thin line portions and a plurality of third thick line portions, each of the plurality of third thick line portions having a line width greater than a line width of each of the plurality of third thin line portions;
the plurality of third thin line portions and the plurality of third thick line portions are alternately arranged in the signal-conductor-layer front-back direction;
in the signal-conductor-layer left-right direction, center lines of the plurality of third thin line portions are positioned leftward relative to center lines of the plurality of third thick line portions;
when viewed in the stacking direction, the seventh section is positioned leftward of the first section in the signal-conductor-layer left-right direction and extends in parallel or substantially in parallel with the first section in the signal-conductor-layer front-back direction;
the seventh section includes a plurality of fourth thin line portions and a plurality of fourth thick line portions, each of the plurality of fourth thick line portions having a line width greater than a line width of each of the plurality of fourth thin line portion;
the plurality of fourth thin line portions and the plurality of fourth thick line portions are alternately arranged in the signal-conductor-layer front-back direction; and
in the signal-conductor-layer left-right direction, center lines of the plurality of fourth thin line portions are positioned rightward relative to center lines of the plurality of fourth thick line portions.

11. The circuit board according to claim 10, wherein
a total of a length of one of the plurality of first thin line portions and a length of one of the plurality of first thick line portions in the signal-conductor-layer front-back direction is equal or substantially equal to a total of a length of one of the plurality of fourth thin line portions and a length of one of the plurality of fourth thick line portions in the signal-conductor-layer front-back direction; and
a total of a length of one of the plurality of second thin line portions and a length of one of the plurality of second thick line portions in the signal-conductor-layer front-back direction is equal or substantially equal to a total of a length of one of the plurality of third thin line portions and a length of one of the plurality of third thick line portions in the signal-conductor-layer front-back direction.

12. The circuit board according to claim 10, wherein
a first differential signal is transmittable to the first signal conductor layer and the fourth signal conductor layer; and
a second differential signal is transmittable to the second signal conductor layer and the third signal conductor layer.

13. A circuit board comprising:
a board body including a plurality of insulator layers that are stacked;
a first signal conductor layer in the board body; and
a second signal conductor layer in the board body; wherein
a line width direction of the first signal conductor layer is defined as a signal-conductor-layer left-right direction;
a direction in which the first signal conductor layer extends is defined as a signal-conductor-layer front-back direction;
a portion of the first signal conductor layer extends parallel or substantially parallel to and is located at a different position from a portion of the second signal conductor layer in the signal-conductor-layer left-right direction;

the portion of the first signal conductor layer includes a plurality of first thin line portions and a plurality of first thick line portions;

each of the plurality of first thick line portions has a line width greater than a line width of each of the plurality of first thin line portions;

the plurality of first thin line portions and the plurality of first thick line portions are alternately arranged in the signal-conductor-layer front-back direction; and in the signal-conductor-layer left-right direction, at least a portion of the plurality of first thin wire portions is farther from the second signal conductor layer than at least a portion of the plurality of first thick wire portions.

14. The circuit board according to claim 13, wherein, in the signal-conductor-layer left-right direction, a width of a portion of the board body is narrower than a width of another portion of the board body.

15. The circuit board according to claim 13, wherein a total of a length of one of the plurality of first thin line portions and a length of one of the plurality of first thick line portions in the signal-conductor-layer front-back direction is less than or equal to half a wavelength of a radio-frequency signal that is transmitted through the first signal conductor layer.

16. The circuit board according to claim 13, wherein, in the signal-conductor-layer front-back direction, a length of each of the plurality of first thin line portions is smaller than or equal to a length of each of the plurality of first thick line portions.

17. The circuit board according to claim 13, wherein the line width of each of the plurality of first thick line portions is less than or equal to twice a distance between a right end of each of the plurality of first thick line portions and a right end of each of the plurality of first thin line portion in the signal-conductor-layer left-right direction.

18. The circuit board according to claim 13, wherein the portion of the second signal conductor layer includes a plurality of second thin line portions and a plurality of second thick line portions;

each of the plurality of second thick line portions has a line width greater than a line width of each of the plurality of second thin line portions;

the plurality of second thin line portions and the plurality of second thick line portions are alternately arranged in the signal-conductor-layer front-back direction; and in the signal-conductor-layer left-right direction, at least a portion of a center line of the plurality of second thin wire portions is farther from the first signal conductor layer than at least a portion of a center line of the plurality of second thick wire portions.

19. The circuit board according to claim 18, wherein a total of a length of one of the plurality of first thin line portions and a length of one of the plurality of first thick line portions in the signal-conductor-layer front-back direction differs from a total of a length of one of the plurality of second thin line portions and a length of one of the plurality of second thick line portions in the signal-conductor-layer front-back direction.

* * * * *